United States Patent [19]
Horie

[11] Patent Number: 4,985,673
[45] Date of Patent: Jan. 15, 1991

[54] METHOD AND SYSTEM FOR INSPECTING PLURAL SEMICONDUCTOR DEVICES

[75] Inventor: Hajime Horie, Mitaka, Japan

[73] Assignee: Tokyo Seimitsu Co., Ltd., Mitaka, Japan

[21] Appl. No.: 353,764

[22] Filed: May 18, 1989

[30] Foreign Application Priority Data

Jun. 3, 1988 [JP] Japan .................. 63-137002
Mar. 31, 1989 [JP] Japan .................... 1-82656

[51] Int. Cl.$^5$ .................. G01R 31/00; G01R 31/02
[52] U.S. Cl. .................. 324/158 R; 324/158 T;
   324/73.1; 364/481; 371/15.1
[58] Field of Search .......... 437/8; 324/158 R, 158 D,
   324/158 T, 512, 522, 73.1; 371/68.1, 68.2, 68.3;
   377/15.1, 22.1; 364/481

[56] References Cited

U.S. PATENT DOCUMENTS

| | | | |
|---|---|---|---|
| 3,052,840 | 9/1962 | Michaelis | 324/158 R |
| 3,084,326 | 4/1963 | Mitchell | 324/158 R |
| 3,441,849 | 4/1969 | Bennett et al. | 324/512 |
| 3,534,263 | 10/1970 | Cook | 324/158 R |
| 3,975,683 | 8/1976 | Behrens et al. | 324/158 D |
| 4,142,151 | 2/1979 | Hansen | 324/158 D |
| 4,163,937 | 8/1979 | Laass | 324/158 T |
| 4,259,636 | 3/1981 | Buser et al. | 324/158 D |
| 4,631,722 | 12/1986 | Voss | 371/68.3 |

FOREIGN PATENT DOCUMENTS 62-28507 6/1987 Japan .

Primary Examiner—Ernest F. Karlsen
Assistant Examiner—William J. Burns
Attorney, Agent, or Firm—Sixbey, Friedman, Leedom & Ferguson

[57] ABSTRACT

A method of inspecting semiconductor devices, wherein a plurality of semiconductor devices of the same type are successively connected to a measuring-inspecting means in a manner to be exchanged over from one to another, and pass or fail of the plurality of semiconductor devices is successively inspected by the measuring-inspecting section. According to this inspection method, at the first semiconductor device, as for a parallel inspection item or items which can be inspected simultaneously, out of inspection items of the plurality of semiconductor devices, said one measuring-inspecting means and the plurality of semiconductor devices are connected in parallel to inspect simultaneously, when the inspection of the parallel inspection item or items is passed, the inspection of the parallel inspection item or items at the time of inspecting the second semiconductor device and thenceforth is omitted, and, when the inspection of the parallel inspection item or items is not passed, each of the semiconductor devices is subjected again to the inspection of the parallel inspection item or items.

1 Claim, 6 Drawing Sheets

SIMULTANEOUS INSPECTION OF SEMICONDUCTOR DEVICES A & B

SIMULTANEOUS INSPECTION OF SEMICONDUCTOR DEVICES A & B

METHOD AND SYSTEM FOR INSPECTING PLURAL SEMICONDUCTOR DEVICES

BACKGROUND OF THE INVENTION

1. Field of the Invention

This invention relates to a method and a system for inspecting semiconductor devices, and more particularly to a method and a system for inspecting semiconductor devices, wherein electric performances of the semiconductor devices are inspected at high speed.

2. Description of the Related Art

As a system for conducting the inspection of performances of the semiconductor devices, there has heretofore been known one shown in FIG. 7. This system is constituted by: two measuring sections 1 and 2, into which two semiconductor devices A and B of the same type are simultaneously delivered; two pairs of measuring-inspecting sections consisting of programmable power sources 3 and 4 and detectors 5 and 6; and a control section 7 for controlling a pair of the measuring-inspecting sections, whereby the semiconductor devices A and B, which are delivered into the two measuring sections 1 and 2, are simultaneously measured and inspected by the above-described the pair of the measuring-inspecting sections.

On the other hand, in an inspection system shown in FIG. 1, a measuring-inspecting section including a programmable power source 13 and a detector 14 is provided for two measuring sections 11 and 12, and switches SW1 and SW2 are switched over to each other, whereby the semiconductor devices A and B are successively measured and inspected (Laid-open Japanese Patent Application No.62-28507).

In the system for inspecting the semiconductor devices as shown in FIG. 7, the two semiconductor devices A and B are simultaneously inspected by the pair of the measuring-inspecting sections, so that an inspecting time T can be shortened as shown in FIG. 8. However, since the pair of the measuring-inspecting sections are required, the problem that the complicated system leads to increased cost is presented.

On the other hand, in the system for inspecting the semiconductor devices as shown in FIG. 1, one measuring-inspecting section is commonly used, so that the system is reduced in cost. However, the semiconductor devices A and B must be successively inspected as shown in FIG. 9, whereby an inspecting time 2T which is twice that of the system shown in FIG. 7, is required.

SUMMARY OF THE INVENTION

The present invention has been developed to obviate the above-described disadvantages of the prior art and has as its object the provision of a method and a system for inspecting the semiconductor devices, wherein one measuring-inspecting section is commonly used, so that the system can be reduced in cost and the inspecting time can be shortened.

To achieve the above-described object, the present invention features that, in a method and a system for inspecting the semiconductor devices, wherein a plurality of semiconductor devices of the same type are successively connected to a measuring-inspecting means in a manner to be exchanged over from one to another, and pass or fail of the plurality of semiconductor devices is successively inspected by the measuring-inspecting means, at the time of inspecting the first semiconductor device, as for a parallel inspection item, which can be inspected simultaneously, out of the inspection items of the semiconductor devices, the measuring-inspecting means and the plurality of semiconductor devices are connected in parallel to each other for simultaneous inspection, when the inspection of the parallel inspection item is passed, the inspection of the parallel inspection item or items at the time inspecting the second semiconductor device and thenceforth is omitted, and, when the inspection of the parallel inspection item is not passed, each of the semiconductor devices is subjected again to the inspection of the parallel inspection item.

The present invention is based on the fact that the parallel inspection item or items, by which the plurality of semiconductor devices can be simultaneously inspected, exist within the inspection items for the semiconductor devices, and as for the parallel inspection item or items, one measuring inspecting means and the plurality of semiconductor devices are in parallel connected to each other for simultaneous inspection. When the inspection of the parallel inspection item is passed (in this case, most of the semiconductor devices are accepted), the inspection of the parallel inspection item at the time of inspecting the second semiconductor device and thenceforth is omitted, thereby shortening the inspection time.

On the other hand, when the inspection of the parallel inspection item is not passed, each of the semiconductor devices is subjected again to the inspection of the parallel inspection item.

BRIEF DESCRIPTION OF THE DRAWINGS

The exact nature of this invention, as well as other objects and advantages thereof, will be readily apparent from consideration of the following specification relating to the accompanying drawings, in which like reference characters designate the same or similar parts throughout the figures thereof and wherein.

DETAILED DESCRIPTION OF THE INVENTION

Detailed description will hereunder be given of the preferred embodiment of a system for inspecting semiconductor devices according to the present invention with reference to the accompanying drawings.

Figure 1:
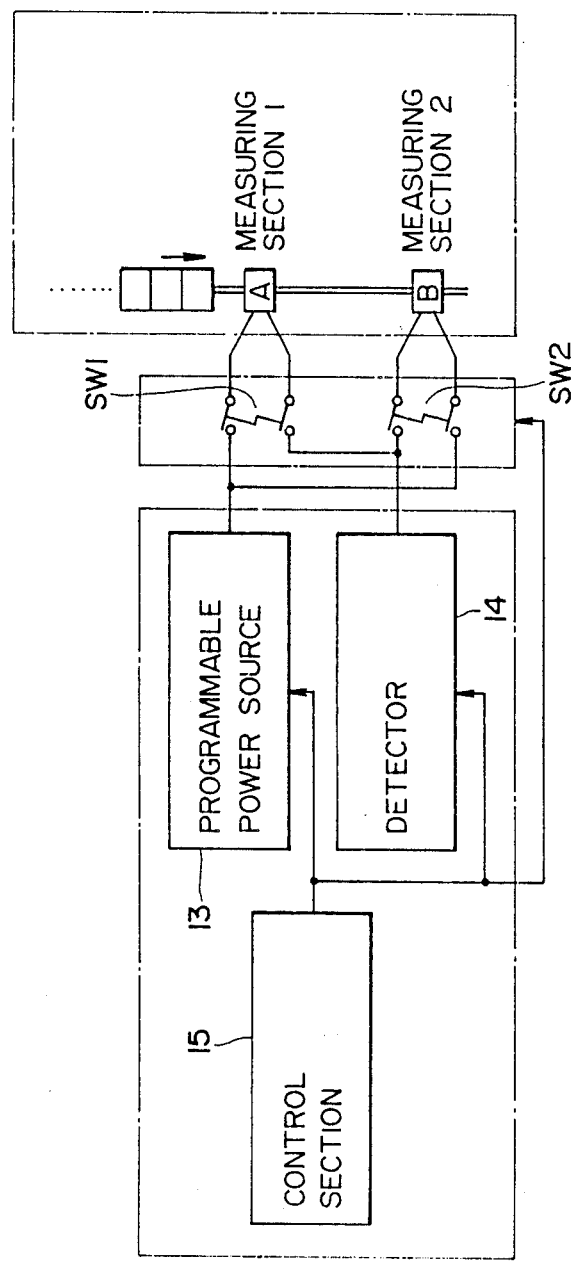
FIG. 1 is a block diagram showing one embodiment a system for inspecting the semiconductor devices according to the invention.

FIG.1 is the block diagram showing one embodiment of the system for inspecting the semiconductor devices according to the invention. The system for inspecting the semiconductor devices is constituted by: two measuring sections 11 and 12, into which semiconductor devices A and B of the same type are delivered simultaneously; a measuring-inspecting section consisting of a programmable power source 13 and a detector 14; switches SW1 and SW2 for alternately exchangingly connecting or connecting two measuring sections 11, 12 in parallel and a measuring-inspecting section; and a control section 15 for controlling the measuring-inspecting section and the switches SW1 and SW2 in accordance with a previously prepared program.

Here, assumption is made that the inspection items for the semiconductor devices A and B are ①, ②, ③ and ④ and ② is a parallel inspection item which can inspect the semiconductor devices A and B simultaneously. However, since two performances are output as one result in the parallel inspection, when this is passed, forth the semiconductor devices A and B are accepted, and, when this is not passed, either one or both the semiconductor devices A and B are not accepted.

Now, the semiconductor devices A and B are delivered into the measuring sections 11 and 12 simultaneously, and measuring needles of the measuring sections 11 and 12 are connected to leads of the conductor devices A and B.

Figure 2:
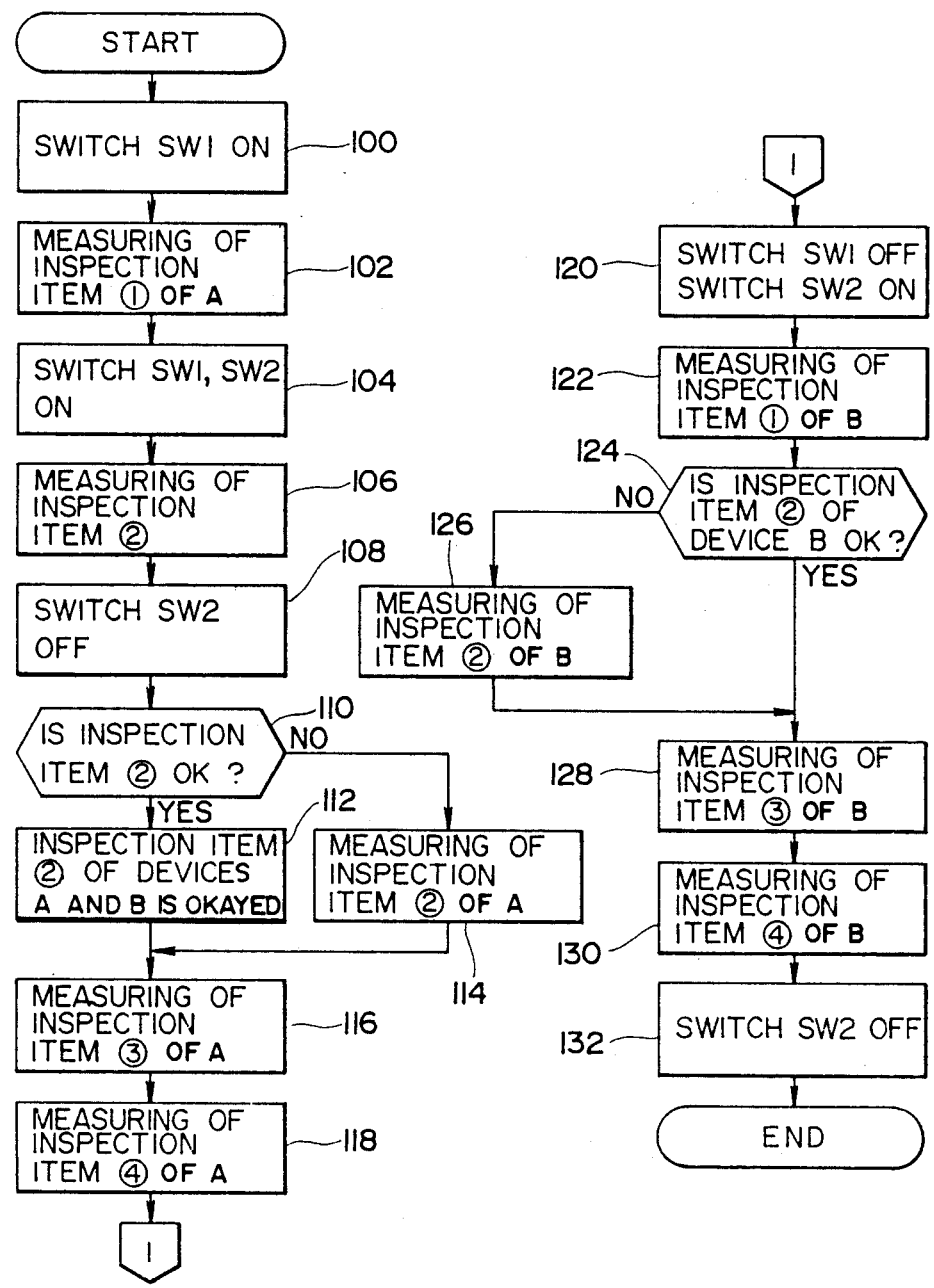
FIG. 2 is a flow chart used for explaining the action of the system shown in FIG. 1.

Description will hereunder be given of a method of inspecting semiconductor devices according to the invention with reference to the flow chart shown in FIG. 2.

First, the switch SW1 is turned on and the semiconductor device A is connected to the programmable power sources 13 and 14 (the measuring-inspecting section) (Step 100). In the measuring-inspecting section, inspection of the inspection item ① is performed (Step 102).

Subsequently, the switches SW1 and SW2 are turned on simultaneously to connect in parallel the semiconductor devices A and B to one measuring-inspecting section (Step 104), and the parallel inspection item ②, which can be inspected simultaneously, is measured (Step 106). Then, the switch SW2 is turned off again (Step 108).

In Step 110, whether the inspection item ② measured in Step 106 is passed or not is discriminated. When the inspection is passed, the inspection item ② is also regarded as being passed and stored (Step 112). When the inspection is not passed, the inspection item ② of only the semiconductor device A is measured again (Step 114).

Subsequently, the inspection items ③ and ④ of the semiconductor device A are successively measured (Steps 116 and 118).

When measuring of all of the inspection items ① ~ ④ is completed by the above-described operations, the switch SW1 is turned off and the switch SW2 is turned on to start measuring of the semiconductor device B (Step 120).

In Step 122, measuring of the inspection item ① is performed. Subsequently, in Step 124, whether the parallel inspection item ② of the semiconductor items A and B is passed or not is determined. When the inspection is passed, measuring of the inspection item ② is omitted. When the inspection is not passed, the inspection item ② of only the semiconductor device B is measured again in Step 126, and then, the process proceeds to Step 128.

In Step 128, the inspection item ③ is measured. After the inspection item ④ is measured finally, the switch SW2 is turned off, thus completing measuring all of the inspection items ① ~ ④ of the semiconductor devices A and B (Steps 130 and 132).

Figure 3:
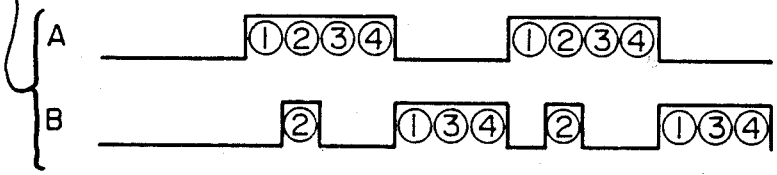
FIGS. 3 and 4 are inspection timing charts of the semiconductor devices when the inspection of the parallel inspection item is passed or not passed, respectively.

FIG. 3 is the timing chart at the time of inspecting the semiconductor devices A and B, showing the case where the parallel inspection item ② is passed. In this case, since the parallel inspection item ② is measured as being passed at the time of inspecting the semiconductor device A, measuring of the parallel inspection item ② is omitted at the time of inspecting the semiconductor device B.

Figure 4:
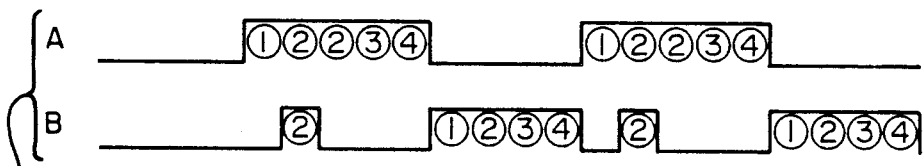

FIG. 4 is the timing chart at the time of inspecting the semiconductor devices A and B, showing the case where the parallel inspection item ② is not passed. In this case, since the parallel inspection item ② is measured as being not passed at the time of inspecting the semiconductor device A, the parallel inspection item ② of only the semiconductor device A is measured again, and all of the inspection item ① ~ ④ are measured at the time of measuring the semiconductor item B.

Figure 9:
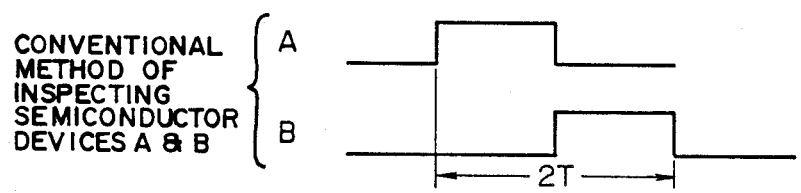

As apparent from FIGS. 3 and 4, if assumption is made that the respective inspection items require the same measuring time, then, when the parallel inspection item ② is passed, the measuring time can be shortened by ⅓ as compared with the conventional inspecting method shown in FIG. 9, and, when the parallel inspection item ② is not passed, the measuring time is extended by ⅛.

During normal inspections, it is impossible to think that the acceptance rate is less than 50% and almost all are accepted, so that the measuring time can be shortened by this inspecting method.

Description will hereunder be given of one example of the above-described parallel inspection item in the case of diodes.

Figure 5:
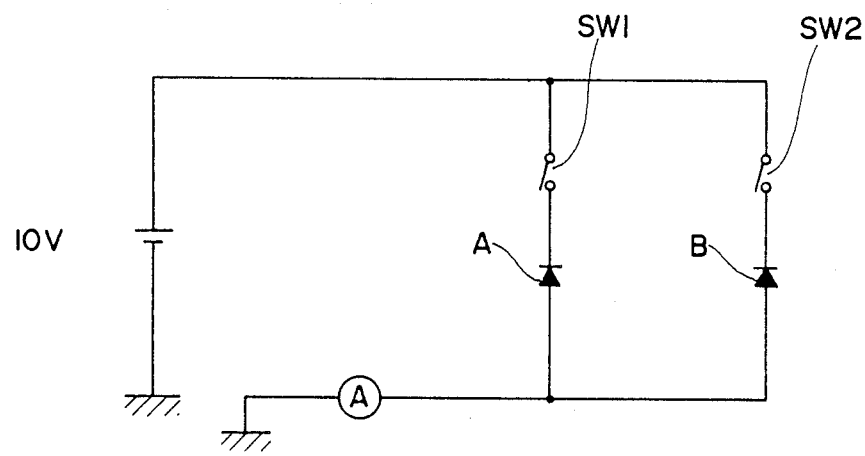
FIG. 5 is a circuit diagram of a leakage current inspection of diodes.

In the case of a leakage current inspection of the diodes (When a voltage of 10V is applied to a diode, if the leakage current is less than 100 nA, the diode is non-defective.), measuring can be made by connecting the diodes A and B parallelly as shown in FIG. 5. As shown in FIG. 5, both the switches SW1 and SW2 are turned on simultaneously, whereby 10V is applied in parallel to the diodes A and B, so that a sum of the leakage currents of the diodes A and B is measured. Since with the non-defectives, leakage current is by far lower than 100 nA normally, if the sum of the detected currents is less than 100 nA, then both the diodes A and B can be accepted. When the diodes are not accepted, opening or closing of the switches SW1 and SW2 is controlled and only one side is measured to inspect pass or fail of the performance.

Figure 6:
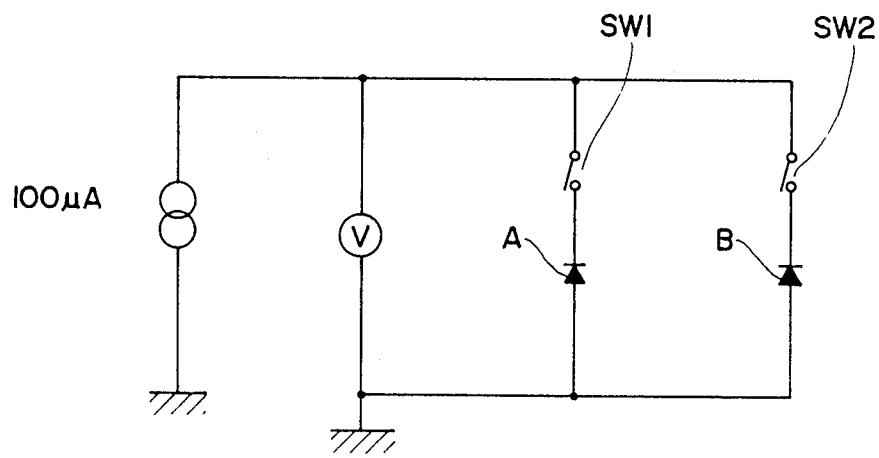
FIG. 6 is a circuit diagram of a withstand voltage inspection of diodes.
Figure 7:
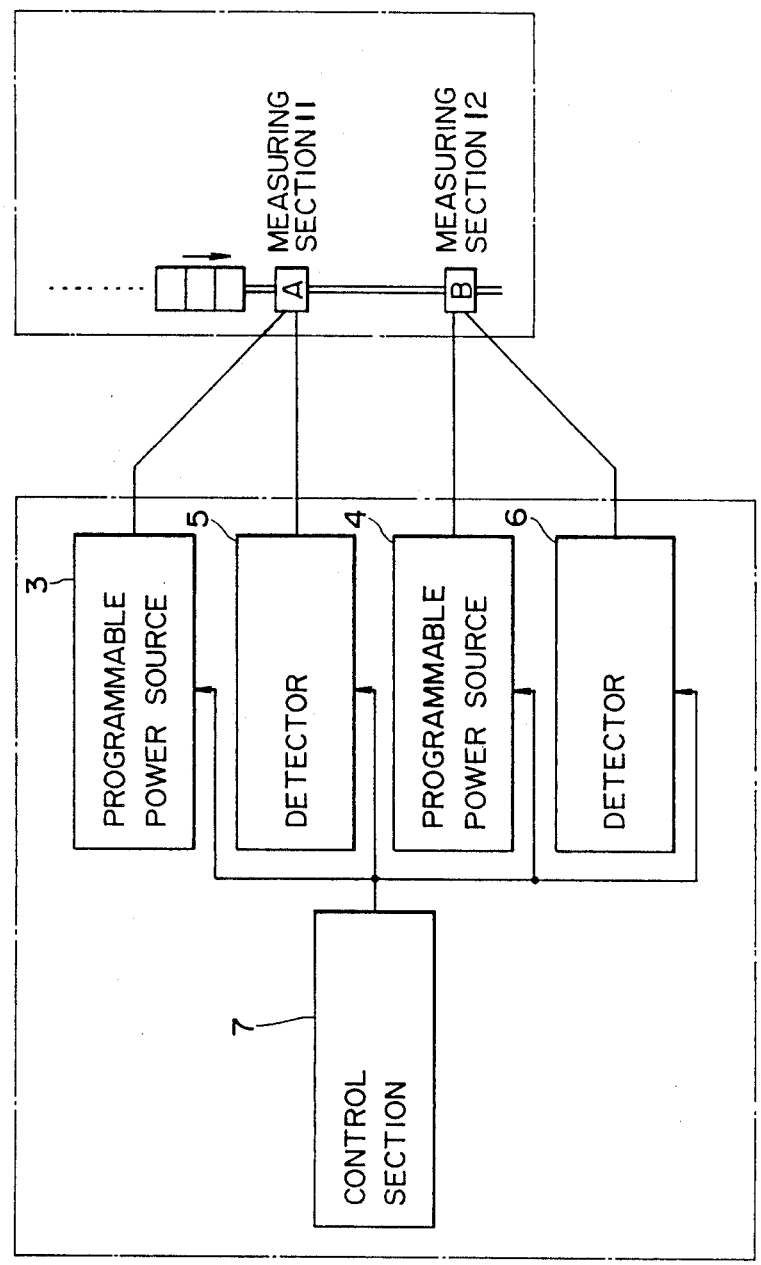
FIG. 7 is a block diagram showing one example of the conventional system for inspecting the semiconductor devices, which has two measuring-inspecting sections; and, FIGS. 8 and 9 are timing charts showing the measuring times according to the conventional method of measuring the semiconductor devices, respectively.
Figure 8:
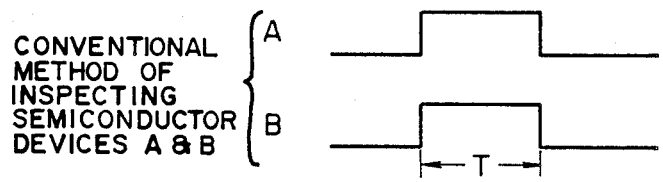

On the other hand, in the case of a withstand voltage inspection (When a current of 100 μA is caused to flow through a diode in the reverse direction, if the applied voltage is more than 30V, the diode is non-defective.), in FIG. 6, the diodes A and B are parallelly connected to each other 100 μA is applied thereto. In this case, a current of 100 μA flows through the semiconductor device lower in voltage standing and no current flows through the semiconductor device higher in voltage standing. In the voltage of the semiconductor device lower in voltage standing is more than 30V for example, then the semiconductor device higher in voltage standing should naturally be a non-defective so that the both semiconductor devices can be accepted.

Incidentally, these leakage current inspection and voltage inspection require the measuring time longer than that of the other inspection items, so that the effect of the inspection time shortening can be improved by making the inspection item as the parallel inspection item. When the number of the parallel inspection items is increased and includes ② and ③ the same processing as in the case of ② should be performed for ③. When three semiconductor devices A, B and C are delivered into the three measuring sections, simultaneously, the measuring times can be shortened by performing the same processing as above.

Further, as the semiconductor device, not only a finished product but also a plurality of semiconductor tips formed into wafer shapes may be adopted. The measuring section in this case is electrically connected to the semiconductor tips through a probe needle.

As has been described above, with the method and the system for inspecting the semiconductor devices according to the invention, the plurality non-defective semiconductor devices are successively inspected by one measuring-inspecting means, and, as for the parallel inspection item or items, which can be inspected simultaneously, the plurality of semiconductor devices are inspected simultaneously, so that the inspecting times can be shortened by use of the inexpensive system having one measuring-inspecting means, which is similar to the conventional system.

It should be understood, however, that there is no intention to limit the invention to the specific forms disclosed, but on the contrary, the invention is to cover all modifications, alternate constructions and equivalents falling within the spirit and scope of the invention expressed in the appended claims.

What is claimed is:

1. A system for inspecting a plurality of items of each of a plurality of semiconductor devices of the same kind, comprising:

a plurality of measuring sections connected to a plurality of semiconductor devices, having one or more of said items which are capable of being inspected simultaneously and one or more of said items which are incapable of being inspected simultaneously, respectively;

a measuring-inspecting means for inspecting pass or fail of the semiconductor devices;

a plurality of switches interposed in parallel between the plurality of measuring sections and the measuring-inspecting means, for ON-OFF controlling electric connection between the measuring-inspecting means and the plurality of measuring sections; and a control means for controlling the measuring-inspecting means and the plurality of switches; wherein:

said control means turns on only the switch of the plurality of switches which controls the electrical connection to a first of said plurality of semiconductor devices to cause said measuringinspecting means to inspect the items of the first semiconductor device which are incapable of being inspected simultaneously;

said control means simultaneously turns on the plurality of switches which control the electrical connections to said plurality of semiconductor devices to cause said measuring-inspecting means to inspect the items of the semiconductor devices which can be inspected simultaneously, and, when the simultaneous inspection of items fails, only the switch which controls the electrical connection to said first of the semiconductor devices is turned on to perform the inspection of items of the first semiconductor device which can be inspected simultaneously;

and, at the time of inspecting items of second and subsequent semiconductor devices, said control means turns on only the switch of said plurality of switches which controls the electrical connection to a respective one of the second and subsequent semiconductor devices being inspected to cause said measuring-inspecting means to inspect the items of the respective semiconductor device which are incapable of being inspected simultaneously, and when said simultaneous inspection of items fails to cause said measuring-inspecting means to also inspect all of the items of the respective semiconductor devices that are capable of simultaneous inspection.

* * * * *